United States Patent [19]

Nellis et al.

[11] Patent Number: 5,112,801
[45] Date of Patent: May 12, 1992

[54] MECHANICAL ALIGNMENT OF PARTICLES FOR USE IN FABRICATING SUPERCONDUCTING AND PERMANENT MAGNETIC MATERIALS

[75] Inventors: William J. Nellis, Berkeley; M. Brian Maple, Del Mar, both of Calif.

[73] Assignee: The United States of America as represented by the United States Department of Energy, Washington, D.C.

[21] Appl. No.: 469,897

[22] Filed: Jan. 24, 1990

[51] Int. Cl.$^5$ ............................................. H01L 39/00
[52] U.S. Cl. ....................................... 505/1; 505/741; 427/62; 427/130; 264/109
[58] Field of Search ..................... 264/109; 505/1, 741; 427/62

[56] References Cited

U.S. PATENT DOCUMENTS 3,752,665  8/1973  Roy et al. ............................. 75/135
4,717,627  1/1988  Nellis et al. ........................... 428/552
4,762,754  8/1988  Nellis et al. ........................... 428/552
4,824,826  4/1989  Damento et al. ....................... 505/1
4,880,771  11/1989  cava et al. ............................. 505/1
4,973,575  11/1990  Capone ................................. 505/1

OTHER PUBLICATIONS

Fiegelson, Science, vol. 240, pp. 1642-1645, 1988.
Arendt, "Aligned Sintered Compact of RBa$_2$Cu$_3$7$_{-x}$", Materials Research Society Symposium Proceeding, vol. 99, pp. 203-208, 1987.

Primary Examiner—Stephen J. Lechert, Jr.
Attorney, Agent, or Firm—Henry P. Sartorio; L. E. Carnahan; William R. Moser

[57] ABSTRACT

A method for mechanically aligning oriented superconducting or permanently magnetic materials for further processing into constructs. This pretreatment optimizes the final crystallographic orientation and, thus, properties in these constructs. Such materials as superconducting fibers, needles and platelets are utilized.

42 Claims, 10 Drawing Sheets

MECHANICAL ALIGNMENT OF PARTICLES FOR USE IN FABRICATING SUPERCONDUCTING AND PERMANENT MAGNETIC MATERIALS

The U.S. Government has rights in this invention pursuant to Contract No. W-7405-ENG-48 between the U.S. Department of Energy and the University of California, for the operation of Lawrence Livermore National Laboratory.

The present invention is related to U.S. Pat. No. 4,762,754 issued Aug. 9, 1988, to the present applicants and to U.S. application Ser. No. 07/449,176, filed Dec. 13, 1989 relating to shock pretreatment of superconducting materials to improve their characteristics.

BACKGROUND OF THE INVENTION

This invention is related to the manufacture of high-quality mechanically aligned superconducting materials using oriented platelet-shaped powder particles, fibers, crystals, and other oriented forms of the recently discovered high-$T_c$ class of superconducting ceramics, as well as other superconducting materials. It is also related to the use of these oriented materials in the manufacture of high quality permanent magnetic materials.

CURRENT PROCESSING TECHNIQUES

Historically, a variety of scientific approaches have been employed by research groups in an attempt to synthesize or fabricate useful superconducting products using strong shock waves. These efforts have met with varying degrees of success. As an example, conventional superconducting materials have been synthesized by Roy using an explosive compaction process (U.S. Pat. No. 3,752,665 granted to Roy et al., Aug. 14th, 1973). Similar efforts have been made to develop permanent magnetic materials using shock synthesis methods.

Since the development of the revolutionary high-$T_c$ superconductors and improvements in permanent magnetic materials, new fabrication techniques have been developed by the research community in an attempt to deal with the physical limitations of these materials. For instance, these new materials are highly brittle in nature, and are easily deformed by most standard manipulation techniques. Also, many conventional methods of processing compromise or destroy the new materials' superconducting electrical and magnetic qualities. Attempts to provide processing techniques which do not unduly comprise the superconducting capacity of these materials have been only marginally successful.

Ceramic Processing—Ceramic processing techniques have been developed by researchers at AT&T Bell Laboratories in an attempt to provide a practical, workable form for the new high-$T_c$ superconductors. The doctor-blade tape casting technique is an example of this approach. Ceramic powder is mixed with a binder, a plasticizer, and a dispersant. The resulting solution is deposited at a controlled thickness on a plastic film. The solvent is evaporated to produced a flexible tape. Because of non-conductive organic components in the tape, this $YBa_2Cu_3O_{7-x}$ tape is not electrically superconducting. Slow heating of such a $YBa_2Cu_3O_{7-x}$ tapes to 300° C. removes the undesirable components and weakly bonds the powder. Heating to 900°-1000° C. produces a dense but brittle superconducting structure.

Ceramic processing techniques have also been investigated b researchers at Argonne National Laboratories and other institutions in an effort to develop wire extrusion techniques which could be successfully applied to the new high-$T_c$ materials. In this approach, a tape casting type slurry is partially dried to Produce a material with a viscous consistency. This material is extruded into a wire form and then coiled. Firing of this construct yields a solid ceramic superconducting wire.

Other ceramic processing approaches to providing workable constructs from the new high-$T_c$ materials have also been investigated. Fine ceramic oxide powders in an organic vehicle have been printed onto a substrate through a screen in order to produce circuity patterns. In a related process, plasma spray techniques have been used to coat arbitrary shapes with superconducting material, producing superconducting composite surfaces.

Metallurgical Processing—A number of researchers have used the classic cold drawing technology to fabricate superconducting wire by packing superconducting powder in a silver tube and then reducing the tube's diameter by 10 to $10^2$ times. The resulting superconducting material must then be annealed in oxygen in order to restore its superconducting qualities. For example, silver-sheathed Bi-Pb-Sr-Ca-Cu-O wires were found to have preferential crystalline alignment with the basal-plane high-Jc crystallographic direction along the length of the wire. ("Ag-Sheathed Bi-Pb-Sr-Ca-Cu-O Superconducting Wires with High Critical Current Density," T. Hikata et al, *Japan. J. Appl. Phys.* 28, L-82-L84, 1989.) The superconducting oxide must be rolled down to a thickness of only about 0.1 mm to achieve alignment. It is desirable to achieve crystallographic oxide layers with larger thicknesses and also with high densities of crystallographic defects to achieve higher critical current densities both in zero and finite magnetic fields than have been observed to date.

Melt-Texture Growth—In this method, sintered bars of $YBa_2Cu_3O_{7-x}$ which are about one centimeter long are melted and then directionally solidified. This approach produces fully dense, long, needle shaped grains of superconducting constructs. The resulting needle axis of these grains corresponds to the a or b axis of the orthorhombic structure of the high-$T_c$ material. These are crystallographic basal-plane directions of highest critical current density. However, it is not practical to produce substantial lengths of superconducting wire using these techniques.

Shock Compaction—Processing superconductors by shock compaction has shown great promise in the superconductor fabrication research area. A patent granted to applicants (U.S. Pat. No. 4,717,627, granted Jan. 5, 1988) and a patent issuing from its continuing application (U.S. Pat. No. 4,762,754, granted Aug. 9th, 1988) provided the first practical methods of shock compacting the new superconducting materials including the new high-$T_c$ materials. These patents are incorporated into the present application by reference thereto.

The extremely high speed and short duration time of the shock wave used in this method allows boundaries between particles to heat and bond without significantly heating the center portions of the particles. In some cases, this effect can be enhanced by mixing the superconducting materials with metal powders to act as a ductile electrically conducting binder. The minimization of temperature increases in the interior of the particles is believed to be caused by the short (microsecond) duration of the compression process and the high thermal quench rate at the inter-particle boundaries. By maintaining a relatively cool temperature in the interiors of particles, the crystal structure and superconducting properties of the bulk of the particle material are maintained. On the other hand, surface heating allows heterogeneous processing of inter-particle boundaries. In this way, the structure of the inter-particle boundaries might be tuned to optimize critical current density between particles. By choosing each particle to be a single crystallite, all grain boundaries could be optimized for critical current density.

Materials processed by shock compaction enjoy a number of characteristics not seen in the uncompacted superconducting or magnetically aligned materials or in superconductors processed by other methods. Shock compaction creates modifications in the microstructure of the new high-$T_c$ materials which change the functioning of the resulting fabrications. For example, the applicants have discovered that shock-induced defects enhance superconducting fluxoid pinning energies in $YBa_2Cu_3O_{7-x}$ and superconducting critical current densities, $J_c$, in $Bi_2Sr_2CaCu_2O_x$.

The inventors have also discovered that the increased flux-pinning energy of shocked $YBa_2Cu_3O_{7-x}$ unexpectedly persists after annealing in oxygen at 890° C. for 53 hours. This is a typical processing temperature used to optimize superconducting properties. Annealing removes the original high density of shock-induced defects but replaces them with a high density of another crystalline defect which is nearly as effective in increasing flux-pinning energy.

The shock compaction step increases conductivity of some superconducting materials. It also allows the use of effectively lower sintering times and temperatures. These modified sintering characteristics minimize the decrease of starting materials' superconducting qualities which can occur during other aspects of processing and are believed to be caused by shock-induced defects.

Process Limitations—The presently available methods for fabrication of high-$T_c$ materials suffer from a number of limitations. Consistent current flow with high critical current density through the fabricated materials over even a small distance has not been reliably achieved. In bulk (as opposed to thin-film) materials a key goal is to arrange the high-$T_c$ oxide such that the direction of highest $J_c$ in the anisotropic crystal structure is along the desired direction of current flow for each crystallite. Achieving this goal is one aspect of this application.

The high-temperature, relatively long term post fabrication sintering required in many of the conventional fabrication methods described above also leads to softening or melting of the internal structure of the superconducting particles. This frequently destroys their superconducting characteristics.

ORIENTED FIBERS, NEEDLES, AND PLATELETS

Recently, a number of laboratories have been able to produce fibers from superconducting materials. For instance, a research group at Stanford has produced fibers from $Bi_2CaSr_2Cu_2O_x$ in which the a-b plane, which is in the high-$J_c$ direction, is parallel to the axis of the fiber (Fiegelson, *Science,* Vol 240, pp. 1642-1645, 1988). Superconducting fibers are generally longer than a millimeter, and can be potentially centimeters or even meters in length.

Prior research in fiber, needle (less than 1 mm in length) and platelet orientation has been very limited. It was recently discovered that some batches of superconducting powders, which are platelets in shape, are oriented with the a-b plane in the plane of the platelet. The plate-like morphology of high-$T_c$ grains has been recognized by a number of researchers (Arendt et al., "Aligned sintered compact of $RBa_2Cu_3O_{7-x}$", *Materials Research Society Symposium Proceedings,* Volume 99, pages 203-208, 1987). Other oriented materials are expected to be recognized or developed.

It would be highly desirable to fabricate a high-$T_c$ superconducting material in which the superconducting particles are oriented with their a-b planes parallel to the direction of current flow. This orientation would allow a more direct path for current flow with highest $J_c$ through the superconducting construct. The effect of such an orientation would be to improve current density over workable lengths of materials. Such a breakthrough in technology is required before the widespread application of superconductors to practical electrical applications can be accomplished. Fabrication of a relatively flexible material that could be produced by automation in desired lengths would be extremely useful for such applications.

With the advent of oriented superconducting high-$T_c$ fibers as precursor materials there lays the promise of fabricating practical superconducting constructs. However, prior to the subject invention, there were a number of impediments to fabricating superconducting constructs for practical applications that had not been overcome by previously available methods.

The new fiber, needle, and platelet forms of the high-$T_c$ superconducting materials suffer from many of the limitations of the particulate form of these superconducting compounds. The brittle ceramic nature of the new superconducting materials remains a limitation to their use. Even slight stress to these superconducting forms can destroy their important oriented quality. After breakage of the oriented materials, current paths are compromised or destroyed. Furthermore, any deformation of surrounding supporting materials can misalign the fragments away from their original planar orientation, which also serves to compromise or destroy the conductive capacity of these materials.

Unfortunately, the many limitations of the prior art fabrication methods are even more disadvantageous when these methods are applied to the new oriented fibers, platelets and other aligned materials. The production of slurries necessary to ceramic processing can lead to disorientation of the materials. Furthermore, fiber or platelet breakage or full shattering may also result from this processing step. Cold drawing methods which have the advantage in some cases of producing crystallographic orientation also tend to deform and break the fiber or platelet structure. These breakages and deformations can severely compromise the superconducting qualities of the final superconducting materials within a construct.

SUMMARY OF THE INVENTION

An object of this invention is to provide a fabricated superconducting or permanent magnetic construct incorporating superconducting fibers, platelets, needles, and/or other crystallographically aligned superconducting or permanent magnetic materials, especially high-$T_c$ materials.

It is an additional object of this invention to provide mechanically aligned particles for use in hot isostatic pressing, cold pressing and sintering, doctor blade methods, or dynamic high pressure processing techniques.

It is a further object of this invention to provide a superconducting filamentary or planar construct wherein conductive metal powders or foils are optionally closely associated with superconducting fibers, needles, and/or platelets, and that such associated metal materials provide mechanical support, thermal stabilization, and electrical safety paths for said fibers.

It is an additional object of this invention to provide a method of producing a superconducting filamentary construct which could be used to produce cables and other appropriate forms of unlimited length.

It is yet a further object of this invention to provide a method of producing a superconducting filamentary construct which can be practiced by continuous and automated methods.

It is another object of this invention to produce filamentary, somewhat ductile superconducting wire forms which can be utilized in conventional electrical applications.

Another object of this invention is to provide a fabrication method obviating and/or minimizing sintering requirements.

The present invention provides for a novel method of producing mechanically aligned materials for use in fabricating a filamentary or planar superconducting or permanent magnetic construct by any of several well-known fabrication methods. Oriented superconducting fibers, platelets, and other aligned superconducting or permanent magnetic forms are the source of material to be mechanically aligned.

In the inventive method, the planar or near planar orientation of superconducting or permanent magnetic fibers, needles, and/or platelets is exploited to produce a linear somewhat ductile, current conducting construct, or a somewhat less ductile planar construct. Because of the many advantages of the inventive method, the superconducting or permanent magnetic material retains its general polar orientation after the inventive fabrication processes. Various methods of orientation, compaction and joinder used in such arts as fiber optics and ceramic matrix composites can be adapted to the present invention. The present method can also be combined with magnetic alignment methods in some cases.

Superconducting materials for high magnetic fields and high electrical current can be embedded by the present method in a metallic medium in order to provide thin, superconducting layers. One advantage to such a construct is that these inventive materials have sufficient strength to withstand the large electromagnetic forces present in a high field superconducting magnet. Further, the metallic medium provides a controlled non-destructive current path which is useful if the superconducting material undergoes a transition from a superconducting state to a normal state. Because of the structure and qualities of the inventive constructs, thermal and mechanical stability is retained.

Shock compaction post-alignment fabrication has the advantage of producing superconductors with superior superconducting properties by virtue of shock-induced defects. This compaction step can be accomplished with shock-wave loading, high-power shocking at dynamic high pressure, or pulsed anvil pressing, among other methods. The advantage of flux-pinning defects can be achieved in other post-alignment fabrication methods by pretreatment of the particles by the shock method. The particles can then be aligned by the method of the present invention and processed by the non-shock fabrication method.

High-$T_c$ materials are believed to have their critical current densities ($J_c$) limited by the creep of superconducting fluxoids. The cause of the flux creep appears to be twofold. The energy barriers which pin superconducting fluxoids in high-$T_c$ materials are about 50 times smaller (at 77° K., Liquid-$N_2$ temperature) than in low-$T_c$ materials (at 4.2° K.). In addition, operating temperatures are about 20 times higher. Hence, flux creep is believed to be thermally activated in high-$T_c$ materials. Flux creep appears to reduce critical current densities.

A way to decrease flux creep and increase flux-pinning energies is to introduce defects, as by shock compaction. The inventors have discovered that the flux pinning energy of $YBa_2Cu_3O_{7-x}$ at 70° K. and 10 kOe is increased significantly by shock compaction.

The present method can be usefully employed utilizing a wide range of conventional superconducting materials and high-$T_c$ materials, either singly or in mixtures. Examples of such appropriate materials are the ceramic oxides of the group $XBa_2Cu_3O_{7-x}$ where x can be Y, Nd, Sm, Eu, Gd, Dy, Ho, Er, Tm, Yb, and Lu or other rare earth elements and O may be partially replaced by F, Br, or Cl, and where x is a small number less than 1, typically 0.1.

Examples of some of the newer materials are $Bi_2Sr_2Ca_1Cu_2O_x$, $Tl_2Ca_2Ba_2Cu_3O_y$ and other related compounds containing Tl and Bi copper oxides. Additionally, newly discovered compounds which have a different electronic structure from the high-$T_c$ compounds are being developed and will also benefit from the processing techniques of the present invention. These materials have electron charge carriers, rather than hole charge carriers in the high-$T_c$ materials. These include $Nd_{2-x}Ce_xCuO_4$.

Appropriate combinations of other superconducting materials useful in the fabrication techniques of the present invention would include, but not be limited to Pb/Mo/S, Eu/Mo/S, Sn/Eu/Mo/S, Pb/Eu/Mo/S, La/Eu/Mo/S, Sn/Al/Mo/S, Nb/N, Mo/N, V/Si, Nb/Si, Nb/Al/Ge, Nb/Al, Nb/Ga, Nb/Ti and Nb/Zr. Other useful combinations of permanent magnet materials include Sm/Co, Fe/B/Nd, Fe/B/Pr, Fe/B/Sm, Fe/B/Eu, Fe/B/Co, Fe/B/Ni, Fe/B/Nd/Pr, Fe/B/Nd/Sm, Fe/B/Nd/Eu, Fe/B/Nd/Co and Fe/B/Nd/Ni.

The shock compacting methods of the present invention are well adapted to mass production and continuous production techniques. The compaction can be accomplished through any number of different means, including two-stage light-gas guns, rail guns, air guns, explosives, magnetic compaction, etc. Use of explosives permit the fabrication of arbitrarily large and/or long constructs. Also, a number of samples can be compacted simultaneously in a club-sandwich style approach. In this aspect of the present invention, the metal and superconducting materials are layered sequentially, or spaced with non-adhering material, and then compacted simultaneously.

Using an elegant and very direct approach, the inventive process calls for superconducting fibers being mechanically aligned and deposited on a supportive surface of metal foil and/or powder. Metal foil and/or powder is layered over the fibers. Shock compaction then takes place. Shock compaction has several advantageous effects, including allowing an intimate contact between the metal and the superconducting material. This contact provides mechanical support, heat quenching and alternative electrical conduit advantages.

When desired, the shock compaction further produces bridging connections between the fibers both laterally and horizontally. Because of this feature, the fibers can be randomly positioned in planes normal to the direction of current flow, and still have a path of electron flow established. In the event that such a pathway were at some points discontinuous, the metal matrix would provide a connection opportunity which would allow transfer of current to an adjacent but non-contiguous fiber. Optionally, some amount of high-$T_c$ superconducting powder can be added so that shock compaction will result in a continuous superconducting path for the electric current.

Using the method of the present invention, the superconducting fibers or platelets can be deposited and mechanically oriented (in some cases simultaneously) by any number of methods, many of which are conventional in the materials processing art. For instance, the superconducting material can be deposited through a moving pipe and sifted downward to produce a trail on a surface. In another method, the deposition pipe remains stationary, with the surface moving steadily underneath the materials flowing from the pipe. Slight vibrations can serve to encourage the deposition of the fibers or platelets from the pipe to the surface. In an alternate system, a grooved or multiply grooved substrate is employed. Randomly applied fibers or platelets are vibrated, air-blown, or brushed into these grooves, thus achieving the correct orientation. Modifications of the procedure to accommodate possible static electric or other interfering phenomena are made.

An effective technique which aligns powder Particles of platelet shape is an aspect of the present invention. A powder composed of particles of similar size is tapped, producing a preform assembly. It is believed that tapping aligns the powder particles in the way that coins in a pile are naturally aligned with their planes preferentially parallel or near-parallel to the surface on which they rest. Subsequent sintering, shock-compaction, or other processing methods are used to bond the powder particles and freezes-in the preferential orientation.

Using the inventive method, brittle fibers and platelet based wire of varying lengths can be processed into workable superconducting cables in a mechanically, electrically and heat-dissipation supporting metal matrix. For long lengths of cable, the preshock materials would be assembled, explosive powders or sheets placed on top of the assemblage, and the entire length shock compacted in a single explosion. This single explosion technique would tend to minimize the formation of interfering boundaries between different segments which might otherwise occur.

It would also be possible using the method of the present invention to electrostatically charge a metal foil, and oppositely charge the oriented fibers so that they would adhere to the foil prior to the bonding process. With a process similar to photocopying, pre-designated circuitry could be directly bonded into place. A physically adhering material, such as an adhesive, could also be used to lay out the desired circuitry, and then be brought into contact with aligned fibers or platelets prior to bonding.

The filamentary wire produced by the inventive method can be bent to a certain degree into a number of desired shapes. However, it is possible to directly fabricate the article produced by the method of the subject invention into a final desired shape, such as an electric coil configuration. This approach would avoid the possibility of inadvertently cracking the material during winding. It would also provide an attractive alternative when there is a preference for sintering, or where a more ridged structure is desired. As an example, if a coil were needed, a form with coiled ridges would be provided. This could be as simple an arrangement as a threaded pipe of some conductive metal such as copper. The pipe could then be electrostatically charged and contacted with superconducting fibers or a mixture of superconducting fibers and metal powder. The pipe would be wiped clean of fibers not lodged in the grooves. This construct would then be slipped into a slightly larger pipe or metal foil cylinder and shock compacted.

In another method for producing a superconducting electrical coil or other desired forms, a non-interfering adhesive could be used to attach the oriented particle in the desired configuration. Alternatively, an adhesive which would be burnt away during sintering can be employed. Thus, a spiral could be provided on a cylinder, and the flow of oriented fibers or platelets attached in a steady stream thereto. An ashless adhesive would be ideal choice for such a system. When the nature of the superconducting material allows, a simple liquid spray can serve to bind the particles to the metal support material prior to bonding, particularly if a tamping preliminary to the shock event is accomplished.

It is further contemplated in the present invention that appropriate grooves in the accepting metal surface could be provided in an X or Y direction. This could be accomplished by stamping a desired pattern on a metal foil and vibrating fibers into place. In the case of shock compaction, the upper foil level could be peeled back, revealing the surface of the superconducting fibers. At that point, fibers could be arranged in the remaining direction and bonded. In the case of platelet materials, both axes can be bonded simultaneously. In this way, circuitry of any desired configuration could be achieved, as in microchip production.

It is further contemplated that where splicing of the produced superconducting cables is required in the field, small self-combusting or self-sintering attachment kits would be provided. These would contain uncompacted fibers and a small, contained explosive charge which could be simply ignited, fusing two adjacent ends of a long cable. In the case of sintering, hot burning fuses are provided. Additionally, long lengths of superconducting material can be joined by very small sections of Cu, for example.

The superconducting materials produced by the present method would be highly desirable in a number of usages. Potential applications for the present invention are long power transmission cables, high-field magnetic uses such as inductive energy stores, motors and generators, and magnetic fusion, among others. Computer technology could employ the present invention in such areas as Josephson junction devices and superconducting transmission lines. Accelerators and free electron laser work would benefit from the present invention. In these areas, the inventive constructs can be used for high Q, high power RF structures, beam transport magnets, high emittance accelerator cathode structures, and wriggler magnets, among other applications. Additionally, there are new and unforeseeable applications for the invention which will be developed in the future.

DESCRIPTION OF THE DRAWINGS

FIGS. 1(D$a,b$) a side cross sectional and top view of the silver powder compacted around the superconducting fibers.

FIGS. 1(E$a,b,c$) is a side cross sectional view of various stages of layering of the silver powder and superconducting fibers.

DESCRIPTION OF THE PREFERRED EMBODIMENT

Figure 1A:
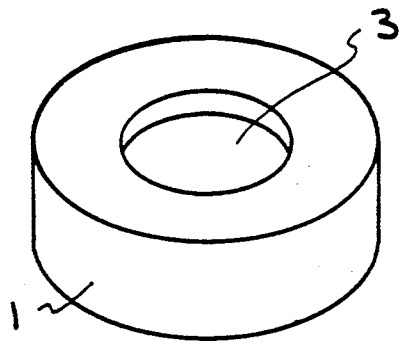
FIG. 1(A) is a three dimensional view of cylindrical copper test sample holder.

The present invention contemplates the manufacture of improved, mechanically aligned high-quality superconducting materials for use in numerous fabrication methods based on the recently discovered classes of ceramic oxide superconducting materials: $RBa_2Cu_3O_{7-x}$, where x is about 0.1, R is Y or any of the lanthanides except for Ce, Pr, Pm (which is radioactively unstable), and Tb, and $T_c$ is about 95° K.; $(La_{2-x}Sr_x) CuO_4$ and $(La_{2-x}Ba_x) CuO_4$ with x between 0.05 and 0.25, and $T_c$ is about 40K; and compounds in the Bi-Ca-Sr-Cu-O system and Tl copper oxide compounds with $T_c$ of 120° K. or less. These materials have anisotropic crystal structures with orthorhombic or tetragonal symmetry. As a result of their anisotropic crystal structures, the physical properties of the materials are anisotropic.

The whisker or fiber form of these materials are now available with the basal plane high-$J_c$ direction of these materials oriented parallel to the axis of the fiber. Fibers can be from 1 mm or more in length and 20 $\mu$m in diameter, preferably 100 $\mu$m to 300 $\mu$m in diameter. Diameters can range as high as about 1-2 mm. The orientation of these materials is exploited in the present invention to produce filamentary or monolithic products with high current conduction. The method of the present invention accomplishes the production of materials with these qualities by mechanically aligning the fibers, and shock compacting or otherwise further processing them to assure their continued correct alignment in a final fabricated product.

The intimate contact between the metal matrix and the superconducting ceramic provided by the compaction process allows for numerous advantages for the resulting filamentary article during electrical current flow. Equally useful post alignment procedures include shock loading, hot isostatic pressing, cold pressing and sintering, doctor blade techniques, among other post alignment treatment methods.

Oriented constructs also occur as oriented platelets. This physical quality apparently occurs naturally in certain batches of superconducting particles, such as those made from micaceous materials, for example. The source of the materials available to the inventors is DuPont, which has provided $Bi_2Sr_2CaCu_2O_x$ and $YBa_2Cu_3O_{7-x}$ materials.

The platlets employed in the subject inventive method are generally regular in their thickness which is considered for the purposes of the subject specification to be the smallest dimension of the particle. However, in the other dimensions, the particles tend to be irregular in their form. Therefore, references to width of particles in the subject specification refers to the particle dimension which can pass through a sieve with perforations of a given diameter, but not through a sieve with perforations of a smaller diameter. References to length of particles in the subject specification refers to the largest dimension of the particle.

As the size of the length and the width of particles become less divergent, there is less of a tolerance for the lowest average width dimension of the particles which would be useful in the subject invention. However, there would be special advantages to similarly shaped particles of the same general dimension in the present inventive method, such as a near circular or near square shape. For instance, with particles of such configurations, it would be much less likely that a long granule would be suspended over an empty space by two smaller granules. Particles with such dimensions would be useful, therefor, in producing a denser, more void-free product.

Typically, the other dimensions of the particles should be about 50% greater than the thickness. Some general useful dimensions are 10 $\mu$m thick with a 30–100 $\mu$m range for the length and width; 20 $\mu$m thick with a 60–200 $\mu$m range for the length and width; and 60 $\mu$m thick with a 180–600 $\mu$m range for the length and width. A 10 $\mu$m thickness would tend to be most useful in a more uniformly shaped particle with length and width dimensions in the range 60 $\mu$m by 50 $\mu$m.

It is believed that the mechanical alignment of superconducting particles accomplished in Examples 1-5 of the present specification were successful because the dimensions of width and length of the particles were greater than its thickness Furthermore, the high-$J_c$ basal-plane direction was in the plane of the platelet-shaped particles. This is a preferred powder shape for use in the subject invention because alignment of the lengths of each particle is not required to achieve high-$J_c$ electrical current flow.

Needle-shaped particles often have a thickness and width which are comparable to one another and much smaller than the length of the particle. Furthermore, the high-$J_c$ direction is generally along the axis of the needles. In such a case, to achieve optimal results from the method of the present invention, the particles need to be aligned with their lengths preferentially oriented in the same direction. Such an orientation can be achieved by passing the particles through a nozzle or funnel whose opening is intermediate in size between the widths and lengths of the needle-shaped particles.

The anisotropic physical properties of the superconducting starting material include the electrical resistivity and magnetic susceptibility in the normal state, and the $J_c$ of the superconductivity state. For technical applications in which large values of $J_c$ and/or $H_{c2}$ are required, it is desirable to orient the crystallites of these compounds in the direction in which $J_c$ and $H_{c2}$ are maximized.

According to the invention, the starting materials are first formed into long thin fibers of nearly uniform crystal structure and orientation or into platelets with the basal plane of the crystal structure along the length of the fiber and in the plane of the platelet. These particles are then mechanically aligned in a desired direction to form a traditionally textured aggregate. The orientation can be 30° or less from center, preferably 15° or less from center, and most preferably 5° or less from center.

The aggregate of aligned particles can then be compacted to form a monolithic compacted superconducting body. The shock compaction pressure can be from 10 to 200 kbars, preferably from 50 to 150 kbars, and most preferably from 60 to 110 kbars. The time of compaction can be up to 10 microseconds, with 0.5 to 5 microseconds preferred.

The aggregate can also be processed into a monolith by shook loading, hot isostatic pressing, cold pressing and sintering, and doctor blade techniques, among other post-alignment fabrication methods.

The oxide superconducting particles can be pure or may be mixed with metal powder to form a filamentary superconductor. These metals include, but are not limited to Ag, Au, Al, and Cu. The size of the metal powder which can be employed in the present invention are from 1 $\mu$m to 40 $\mu$m, preferably from 2 $\mu$m to 10 $\mu$m. In some cases, mixtures of particles sizes will be advantageous, such as when voids between larger size superconducting particles are filled by the inclusion of finer grade metallic powder. In more spherical powders, careful selection of the percentages of particle sizes in the mixtures will yield optimum results.

Methods of compaction include, but are not restricted to gas guns, explosives, railguns or electromagnetic launching, and magnetic compression systems. The setups and machinary for explosive methods are well known, see, for example, *Shock Waves for Industrial Applications*, (L. E. Murr, ed, Noyes Pub., Park Ridge N.J., 1988,) and Nellis et al., *High Temperature Superconducting Compounds*, (Whang et al., Eds. TMS Pbs., Warrendale, Pa., p.249, 1989). Many similar configurations would also be appropriate. As this system is further developed, many other methods will be predictably construed.

The present invention is also useful for producing permanent magnetic materials from oriented magnetic platelets and crystal materials with anisotropic magnetic properties. Examples of such materials are Fe/B/X and Fe/B/X/Y, where X and/or Y are selected from the group consisting of Nd, Pr, Sm, Eu, Co, and Ni. These materials are aligned in the desired direction by any of the means described above. They are then dynamically compacted to produce a coherent body of materials. Dynamic compaction introduces desirable crystal defects in these materials as it does in superconducting materials. These defects pin the fields in the crystallites and thereby produce magnetic materials of enhanced magnetic properties.

EXAMPLE 1

Shock Compaction of Superconducting Fibers in Silver Powder

Superconducting $Bi_2Sr_2CaCu_2O_8$ fibers were provided to the subject inventors by Dr. R. Feigelson of the Stanford University Center for Materials Research. The fibers consisted of a few long grains of the superconducting material with the basal-plane high-critical-current-density direction of the crystal structure oriented along the length of the fibers. The fibers were produced by the method set forth in the Science article cited above (Fiegelson, id). These fibers were 260 $\mu$m in diameter and 7 mm in length. They were kept in a desiccator prior to their assemblage into the test capsule described below.

Figure 1B:
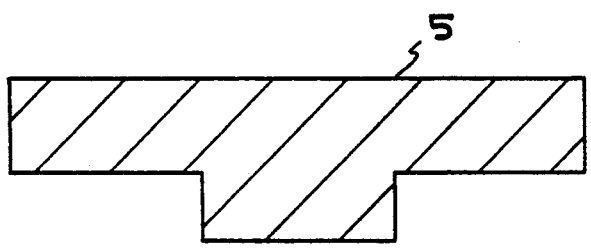
FIGS. 1(B$a,b,c$) is a cross sectional view of cylindrical copper test sample holder and steel plunger.
FIG. 1(C) is a three dimensional view of the silver powder compacted around the superconducting fibers.
FIG. 1(F) is a side cross sectional view of cylindrical copper test sample holder in steel recovery fixture.
Figure 1B:
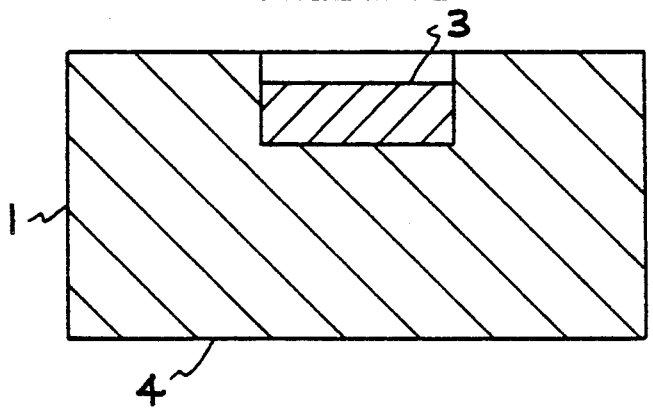
Figure 1B:
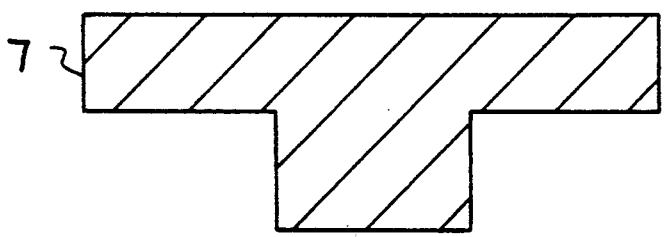

As shown in FIGS. 1A and 1B$a,b$, a cylindrical copper test sample holder 1 was tooled which had a diameter of 25 mm and a height of 6 mm. A cylindrical hole 3 was then drilled into test sample holder 1 which was concentric with the circle of the test sample holder cap 5. The cylindrical hole 3 extended to within 2.3 mm of the test sample holder base 4.

Figure 1C:
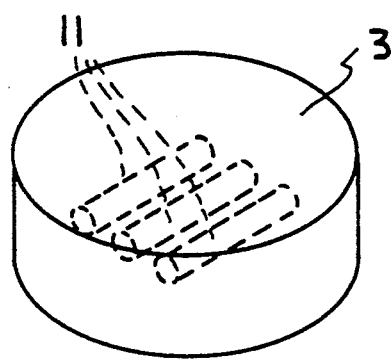
Figure 1D:
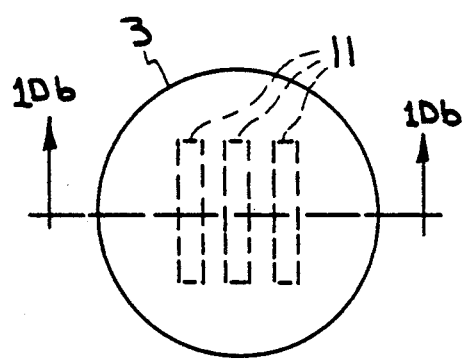
Figure 1D:
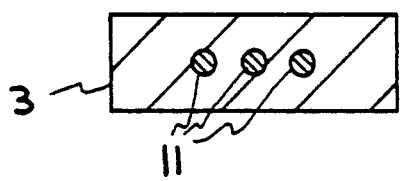
Figure 1E:
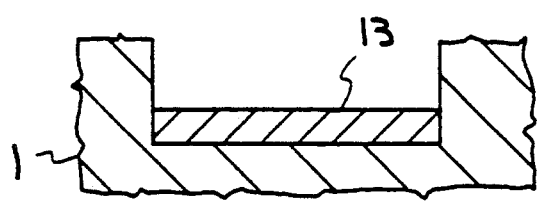
Figure 1E:
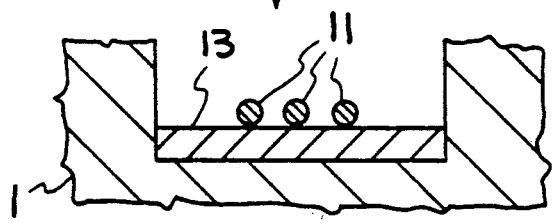
Figure 1E:
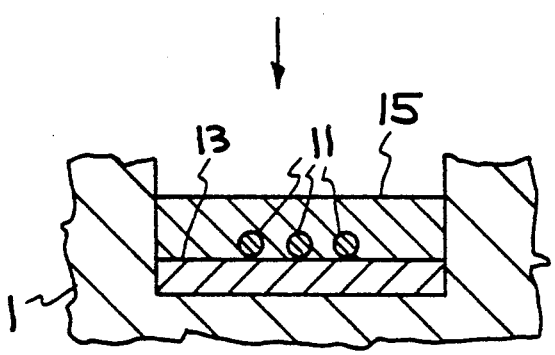

Silver powder (Aesar Inc.,) with particles of 0.8-1.3 $\mu$m in diameter was placed with a spatula into the cylindrical hole 3 to a level of 0.5 mm as in FIG. 1E$a$. Silver powder with 10 $\mu$m particles (unavailable at the time) would have been preferred in order to increase heat generation at the interface of the particles during compaction, permitting a lower pressure for compacting the silver and minimizing the probability of fracturing the fiber.

The silver powder layer 13 was then tapped using a solenoid tapper with a steel plunger 7 (FIG. 1B,C) fit to the diameter of the cavity, replacing the test sample holder cap 5 during tapping. The silver powder layer 13 (FIG. 1E$a$) was tapped to about 50% of silver crystal density. The tapping served to increase powder density and thus minimize material motion and heat generation during shock compaction.

On the surface of the tapped silver powder layer 13, three fibers 11 were laid parallel to each other with about 1 mm spacing between them as in FIGS. 1E$b,c$. Additional silver powder was applied and tapped down as above. Sufficient additional silver powder 15 was added to bring the entire silver powder level to a thickness of 1.2 mm. A top view and a side view of this assemblage is shown in FIGS. 1D$a,b$. A three-dimensional view is shown in FIG. 1C. After compaction, the prepared shock capsule was stored in a desiccator.

A capsule so loaded prior to shock-compaction was visually inspected. The tapped silver powder layer 13 over the fibers 11 was scrapped away carefully in order to view the fibers 11. It was found that there was no cracking of the fibers 11 despite tapping against the flat steel plunger surface of the silver powder layer 13.

Figure 1F:
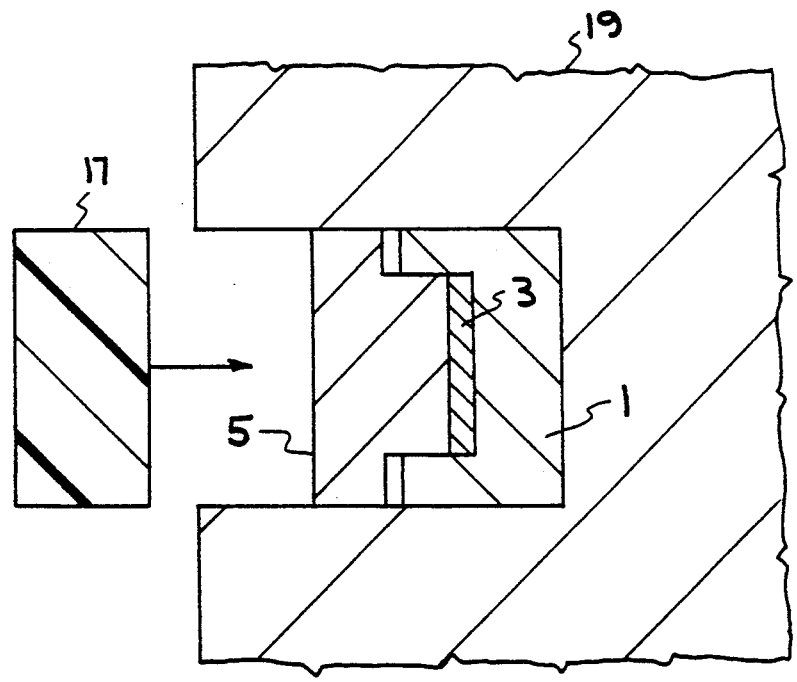

Two capsules assembled as above were shock-compacted using the plastic projectile 17 as shown in FIG. 1F. One was shocked at 30 kbars and the other at 58 kbars in the steel fixture 19 of FIG. 1(F) for about 3 microseconds. The machinery used for this process was a two-stage light-gas gun well known in the art (A. H. Jones et al., *J. Appl. Phy.* Vol. 37, pp. 3493–3499, 1966).

Post-shock analyses of these samples showed close mechanical contact of the compacted additional silver powder layer 15 with the superconducting fibers 11. This was observed in part by the imprinting of the fibers' forms on the texture of the outer surface of the silver in casing material. The fibers 11 remained essentially where they were placed initially. However, the top addition silver powder layer 15 was separated slightly from the bottom silver powder layer 13 and was easily peeled off exposing the three fibers 11 which fractured in several places.

The separation of the additional silver powder layer 15 from the silver powder layer 13 and fibers 11 has several advantages. For instance, it facilitates pre-production testing and lead wire application. However, the point of the present work was to provide a one-piece monolithic filamentary product. Therefore, in the next trial the first tapping step was eliminated.

EXAMPLE 2

Modified Shock Compaction of Superconducting Fibers

Sample preparation and materials were the same as in Example 1 with the following exceptions: No pretapping of the silver powder layer 13 was done, but rather this layer was manually shaken horizontally to simply level the silver powder. 203 mg of 5–8 $\mu$m diameter silver powder was applied in this step. Two superconducting fibers were then placed on the silver about 5 mm apart. Another 209 mg of silver powder (5–8 $\mu$m) was placed on top of the fibers. The assembly was then tapped with steel plunger 7 (FIGS. 1B,C) to 62% of silver crystal density, as in Example 1.

Visual inspection of the pre-shock capsule did not indicate that the fibers had cracked in the final tapping process. That is, the imprint of the fibers on the texture of the top surface of the additional silver powder layer 15 showed no detectable cracks in the fibers.

One test capsule prepared as above was shock-compacted at 29 kbars for about 3 microseconds. While the result was generally positive, partial peeling of the additional silver powder layer 15 from one of the fibers was observed. The silver powder was shock-compacted to 96% of silver crystal density. The first exposed fiber, however, was observed to have fractured in several places. The second fiber, encased in silver, was inserted into a SQUID magnetometer. The magnetic susceptibility data showed a superconducting transition at $T_c = 90°$ K., the same as for the unshocked fibers. Thus, the fiber sample superconducted in bulk after shock-compaction.

Figure 2A:
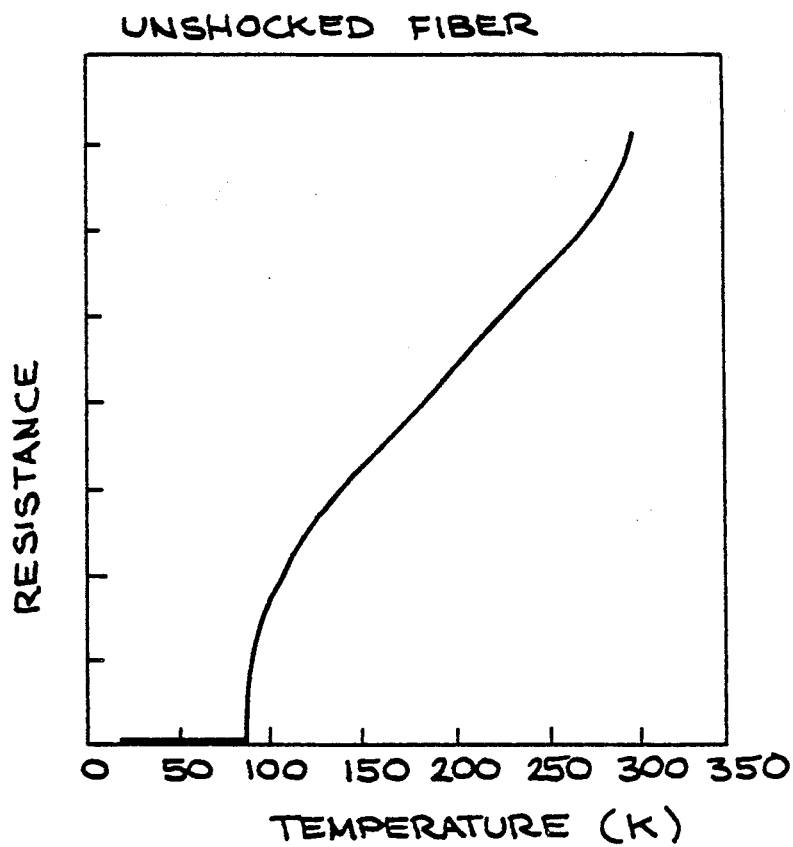
FIG. 2(A) shows the electrical resistance of unshocked $Bi_2Sr_2CaCu_2O_8$ fiber.
Figure 2B:
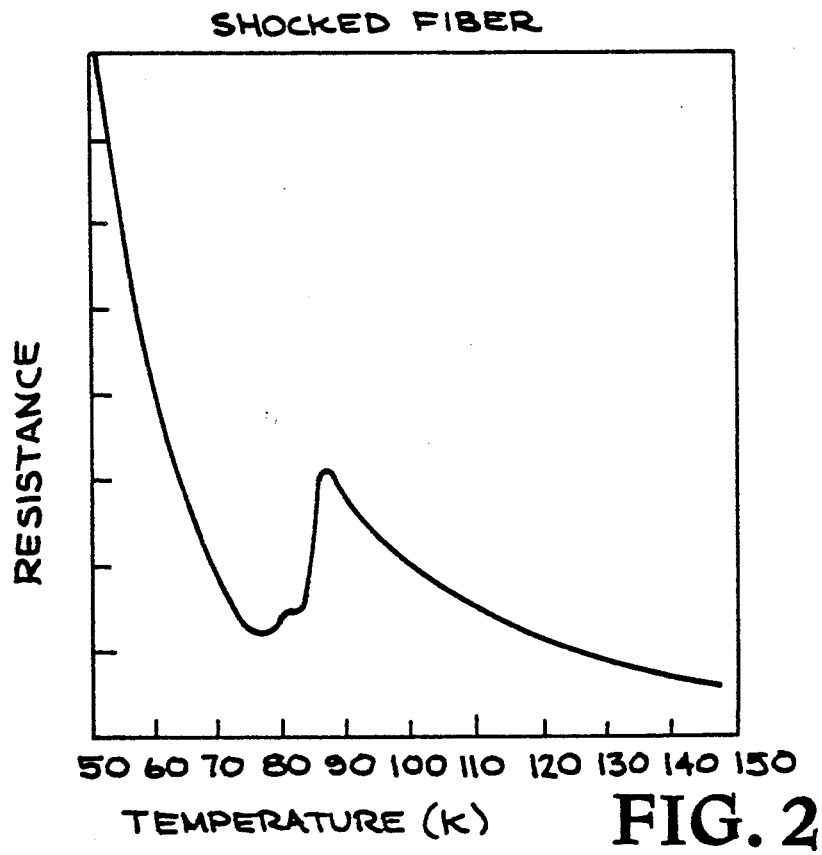
FIG. 2(B) shows the electrical resistance of $Bi_2Sr_2CaCu_2O_8$ fiber shock compacted at 30 kbar in silver powder.
Figure 3A:
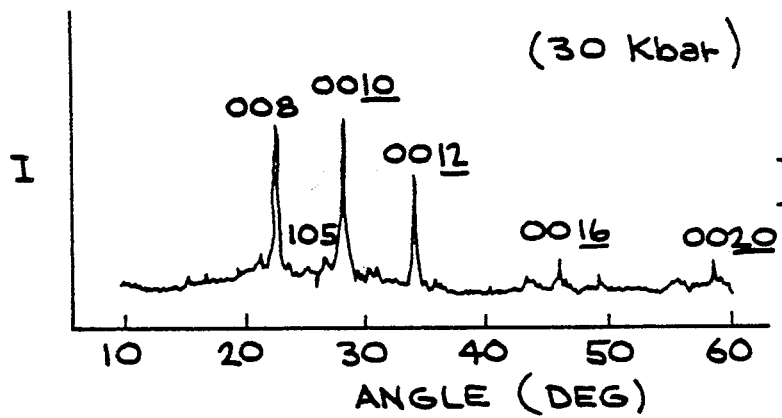
FIGS. 3A–D shows x-ray diffractometer scans of the samples produced in Example 4.
Figure 3B:
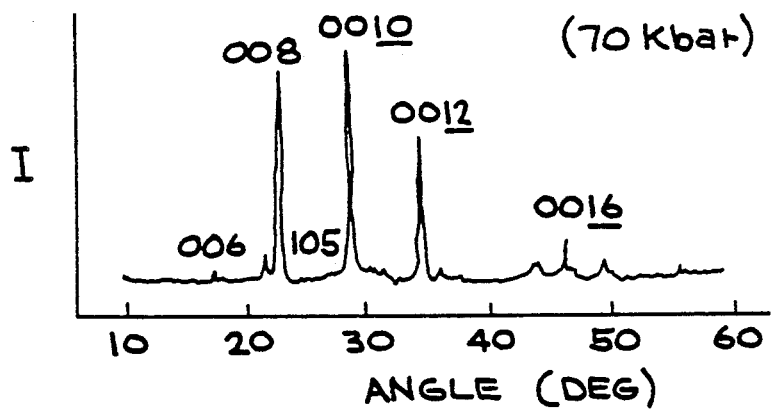
Figure 3C:
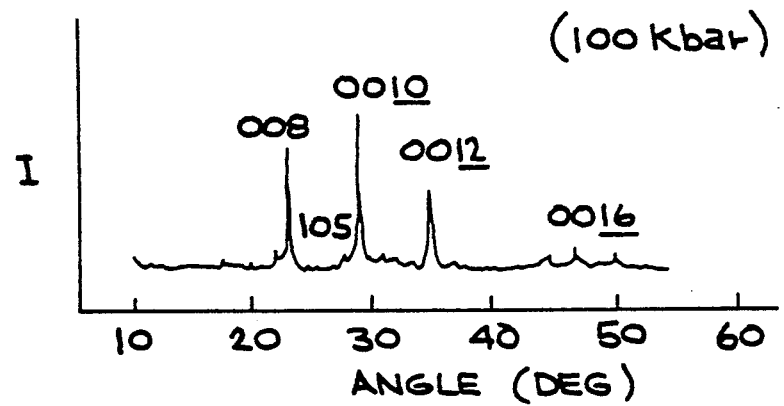
Figure 3D:
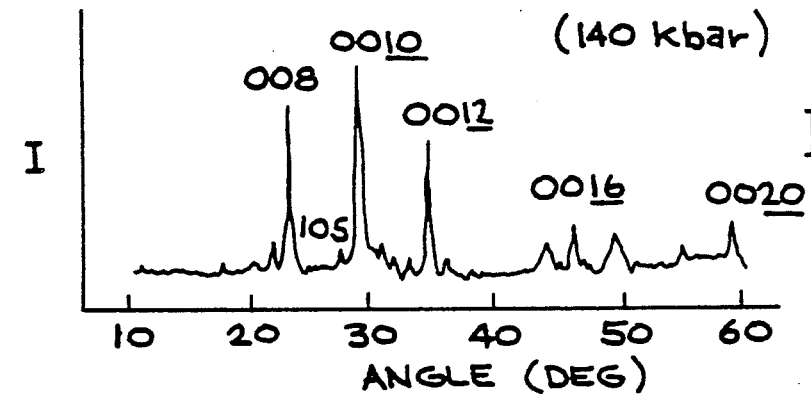

A second pair of superconducting fibers were coated with a 1.2 $\mu$m-thick layer silver by vapor deposition and shock-compacted in 5–8 $\mu$m silver powder at 30 kbar in the same manner as the pair of fibers were processed as just described. Poor electrical contact was achieved between the silver and the fiber. To test electrical transport in the fibers the silver layer on top of one of the fibers was polished away to uncover the fiber. Four electrical leads were attached to the fiber to provide for current and voltage leads and the fiber resistance was measured as a function of temperature. Similar measurements were made on an unshocked fiber for comparison. The resistance data for both are shown in FIGS. 2A–B. The shock-compacted specimen showed a superconducting transition at 86° K., as did the unshocked fiber. However, the transition was not complete and a portion of the specimen was transformed to a semiconducting phase after the shock processing step.

EXAMPLE 3

Shock Compaction of Superconducting Platelet Particles + Ag Powder

In this example, $Bi_2Sr_2CaCu_2O_8$ powders with platelet shape particles were chosen. These powders were about 10 $\mu$m in thickness and passed standard sieves for 20–30 $\mu$m particle size. This powder was mixed with 30 vol % silver. The powder mixture was tapped into two Cu capsules of the type shown in Examples 1 and 2 above. The purpose of the tapping procedure was to obtain high powder density and to settle the platelets with their planes oriented preferentially in the plane of the specimen cavity.

The mixture was tapped to a density of 4.34 g/cm$^3$ in Sample A and 4.38 g/cm$^3$ in Sample B. The materials were tapped into layers in a specimen cavity in the Cu capsules which were 0.50 mm thick and 10 mm in diameter. The basal-plane high-current-density direction of the crystal structure was in the plane of the platelets. The shock compaction at 58 kbar and 87 kbar then compacted the powder into a construct with a highly crystallographically ordered texture.

X-ray diffraction analyses of these constructs demonstrated strong lattice reflections of the type [002n] [zero, zero, even number] indexed to the $Bi_2Sr_2CaCu_2O_8$ structure plus silver. These reflections, observed by shining the X-ray beam perpendicular to the face of the shock compacted disks' surfaces, indicated that the c-axis of the particles was very close to the perpendicular of the disk surface.

Magnetic data showed a large anisotropy in the screening and Meissner signals depending on whether the magnetic field was applied perpendicularly or parallel to the disk surface. For 58 kbar processing, the zero-field-cooled screening signal in the perpendicular configuration was $-1.0 \times 10^{-4}$ emu/g of superconducting sample and in the parallel direction it was $-0.15 \times 10^{-4}$ emu/g of superconducting sample at 10° K.

Both the X-ray and magnetic data indicated that a substantial preferential orientation of the basal plane in the plane of the disk was achieved. The manufactured superconducting constructs were crystallographically oriented compacts of the high-$T_c$ material $Bi_2Sr_2Ca_{1-}Cu_2O_x$ mixed with silver.

Electrical resistance measurements on these specimens showed only a monotonically decreasing resistance with decreasing temperature, even at temperatures below the $T_c$ of the compacts measured magnetically. This showed that the resistance of the 30 volume % silver was much less than the contact resistance between the superconducting material and the silver matrix. As a result, the experiments of Example 4 were performed with the silver omitted.

EXAMPLE 4

Shock-Compaction of Oriented Superconducting Platelet Powders

A shot series of five shock-compaction experiments (BT01-BT05) were performed using $Bi_2Sr_2CaCu_2O_8$ (Bi2212) platelet-shaped particles about 10 μm thick and sieved in order to retain a powder with a 30-37 μm particle size to be employed in further processing. Shock pressures were generated by 6 g, 20-mm-diameter composite polycarbonate and polyethylene plastic projectiles accelerated by a 6.5m long two-stage light-gas gun. Impact velocities of the polycarbonate impact surfaces were 0.85, 1.2, 1.5, 1.9, and 2.4 km/s, which produced nominal impact shock pressures of 30, 50, 70, 100, and 140 kbar. The pure Bi2212 powder specimens were placed and tapped into a Cu capsule as in FIG. 1A. The powder specimens were 10 mm in diameter and initially about 0.5 mm thick. Initial densities were 4.37, 4.39, 4.27, 4.40, and 4.19 g/cm³, respectively. The Cu capsules were placed in the steel recovery fixtures of FIG. 1(F).

The data from the X-ray diffractometer scans taken normal to the faces of the shock-compacted disks are shown in FIGS. 3A-D for the specimens that were processed at 30, 70, 100, and 140 kbar, respectively. The strong zero-zero-even number reflections demonstrated a strong orientation of the compacted particles with the c axis of the crystal structure aligned preferentially normal to the face of the disk and thus with the basal plane high-$J_c$ direction in the plane of the disk.

Figure 4A:
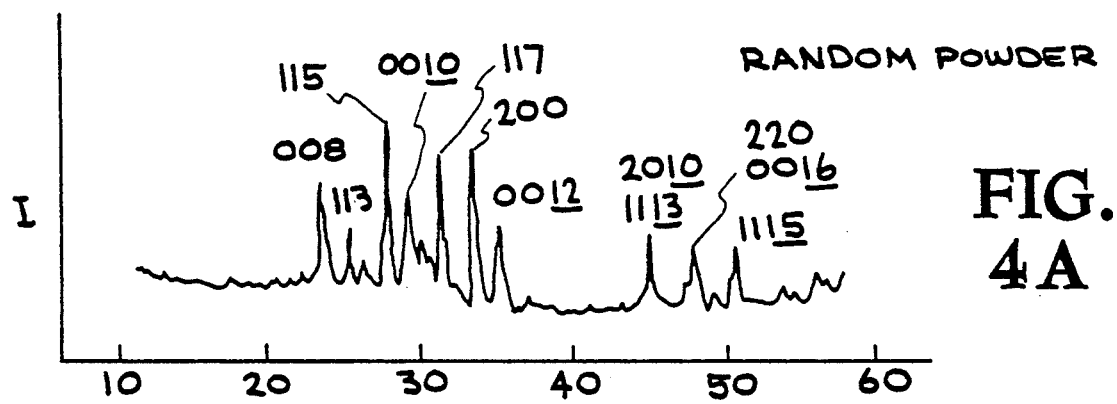
FIGS. 4A–D shows x-ray diffractometer scans for various aligned materials shown in Example 4.
Figure 4B:
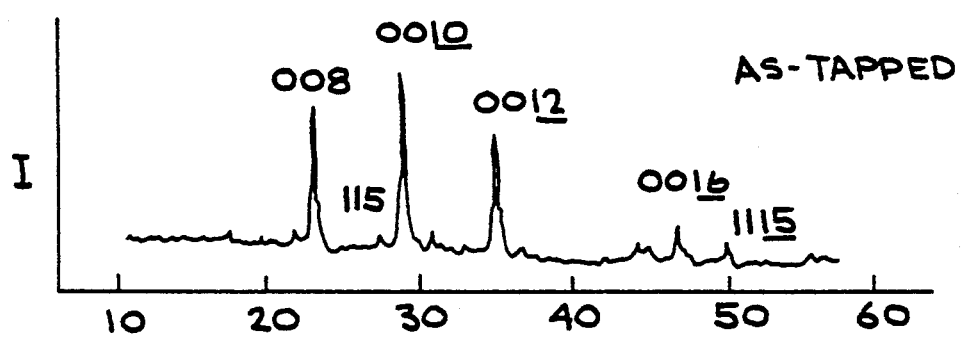
Figure 4C:
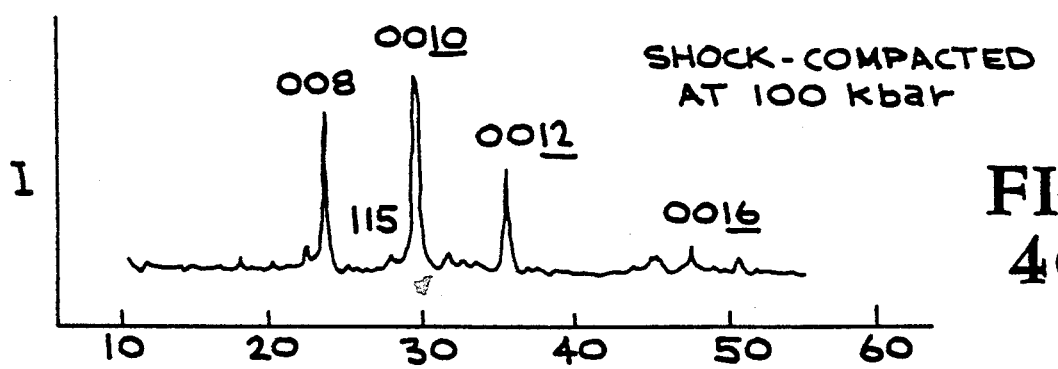
Figure 4D:
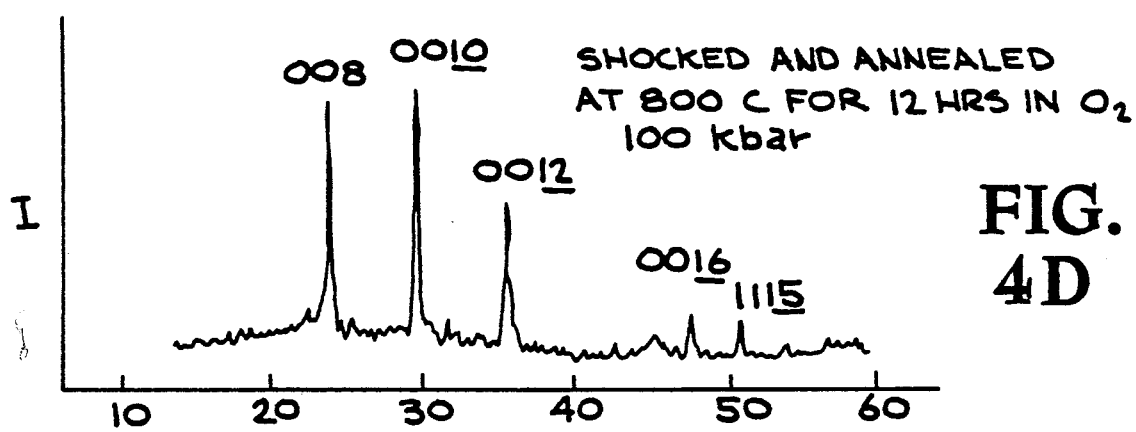

FIGS. 4A-D illustrates the alignment process. The data from the X-ray diffractometer scan of the powder randomly sprinkled on a glass slide is shown in FIG. 4A. The platelet-shaped particles with controlled Particle sizes about 10 μm thick and 30-37 μm wide (by sieving) were tapped. The tapping produced the preferential crystallographic orientation in the copper capsule, as shown in FIG. 4B for the as-tapped powder. FIG. 4C shows that shock-compaction maintained the preferential alignment of the superconducting precursor material in the monolithic compact. The process was similar to shocking an ensemble of coins having similar diameters with their diameters aligned preferentially parallel to the surface on which they were placed. FIG. 4D shows that the shock-compacted specimen annealed at 800° C. in $O_2$ for 12 hours retained the preferential orientation.

Figure 5:
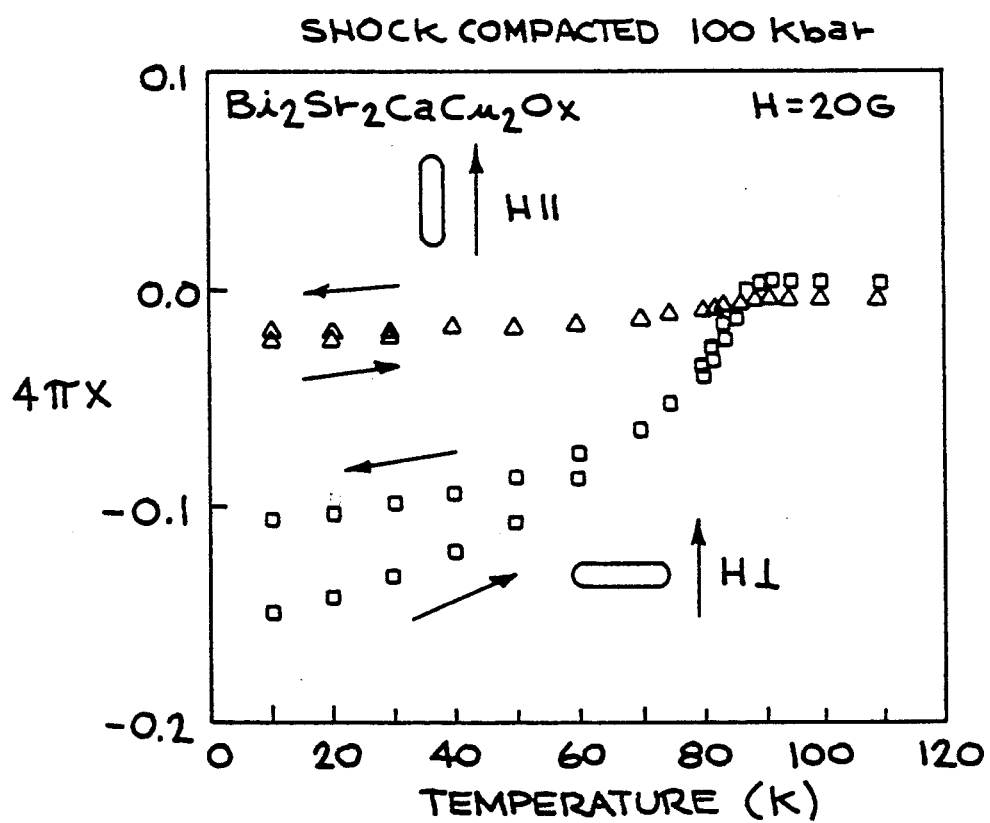
FIG. 5 shows the magnetic susceptibilities of the 100 kbar specimen of Example 4 shock-compacted at 100 kbar and oriented perpendicular and parallel to the applied 30 oe magnetic field.

The magnetic moment of a specimen from each shock-compacted disk was measured with a 30 oe magnetic field aligned first perpendicularly and then parallel to the face of the compact. Results which show the large orientation dependence in the zero-field-cooled (screening) and field-cooled (Meissner) data are provided in FIG. 5 for the specimen shock-compacted at 100 kbar. The ratio of the screening moments perpendicular to those in the parallel configuration are plotted in FIG. 6. This anisotropy ratio is 6-7 for essentially all shock pressures of compaction and for all temperatures of the magnetic measurements. This result showed that the preferential alignment was a bulk effect throughout each compact and that little particle fracture occurred during the shock compactions. Optical micrographs of polished specimens of each compact showed a highly textured structure with no visible cracking. However, there may have been some cracking of the specimens on a scale too fine to be observed using this method.

Figure 7:
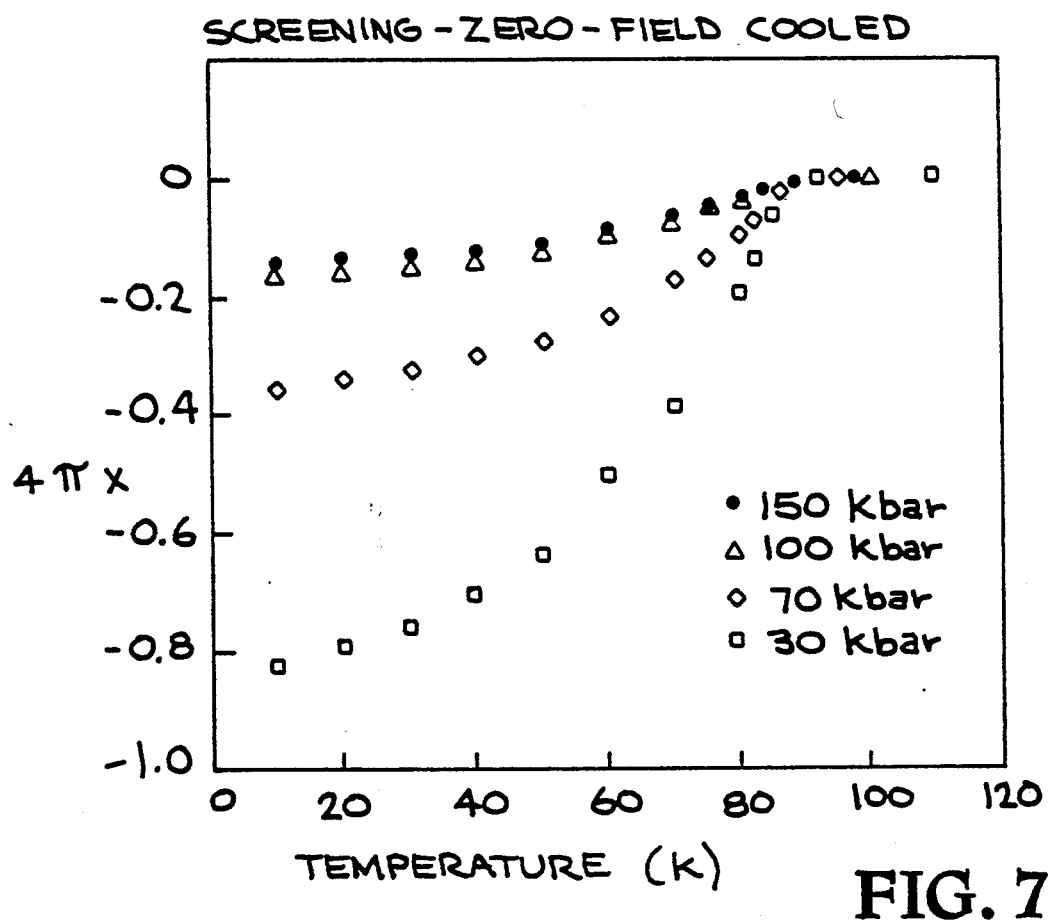
FIG. 7 shows zero-field-cooled screening magnetic susceptibilities in a perpendicular field of 0 oe versus temperature for specimens of Example 4.

FIG. 7 shows the zero-field-cooled screening magnetic susceptibilities of the samples of FIGS. 3A-D in a perpendicular field of 30 oe are plotted against temperature. The superconducting transition temperature $T_c$ was about 90° K. for all the specimens and for the unshocked powder as well (not shown).

Figure 8:
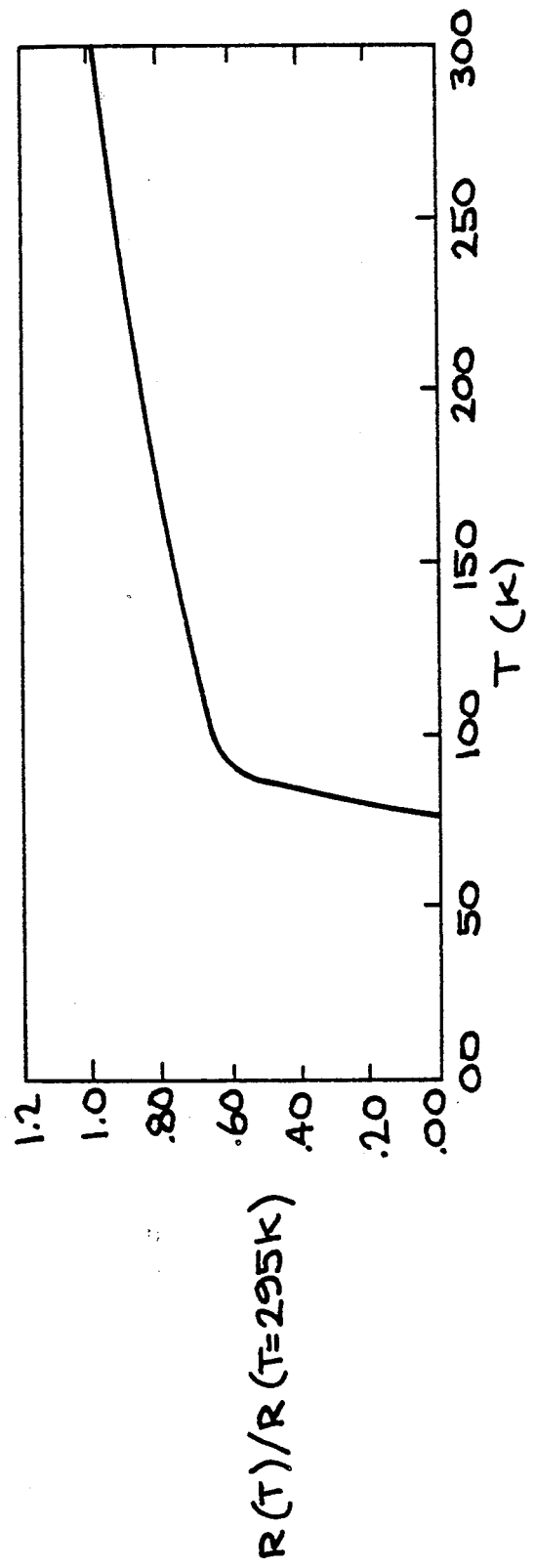
FIG. 8 shows the normalized electrical resistance $R(T)/R(T=295° K.)$ plotted versus temperature for 100 kbar shocked and annealed specimen.

FIG. 8 shows the normalized electrical resistance $R(T)/R(T=295K)$ plotted versus temperature T for the specimen shock-compacted at 100 kbar and then annealed at 800° C. in $O_2$ for 12 hours. The superconducting transition is shown with an onset temperature of about 90° K. This specimen with metallic resistance versus temperature was preferentially aligned crystallographically as shown in FIG. 4D.

EXAMPLE 5

Sintering of Oriented Superconducting Platelet Powders

A pellet of platelet-shaped $Bi_2Sr_2CaCu_2O_8$ particles about 10 μm thick and sieved for 37-45 μm particle size was tapped, cold-pressed, and then sintered. The temperature was increased over 1 hour to 870° C. in air, held for two hours in air, decreased during two hours to 600° C. in air, held at 600° C. in Ar for two hours and then furnace-cooled in Ar.

Figure 9A:
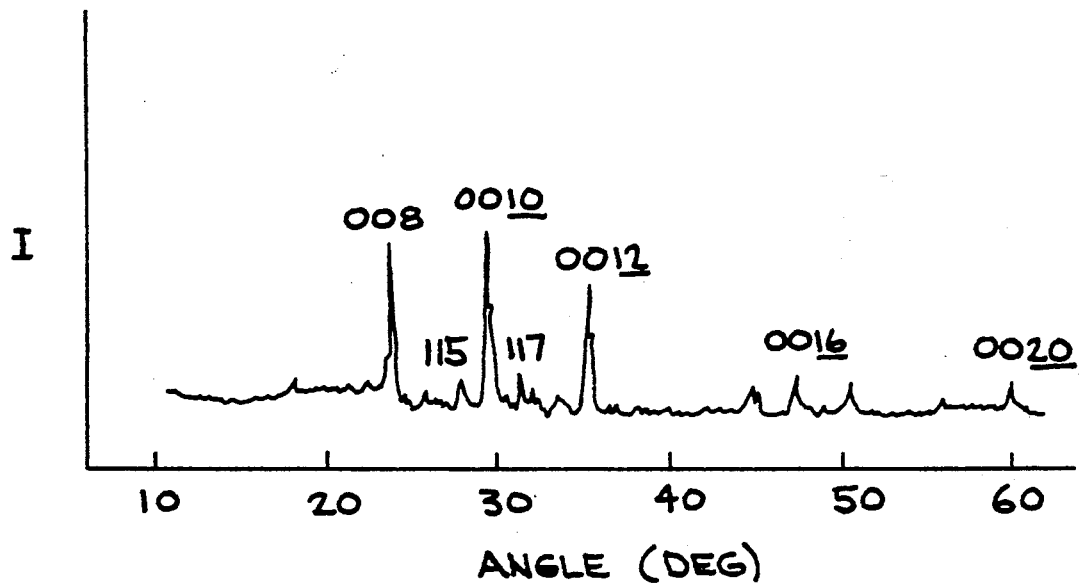
FIGS. 9A and B shows the x-ray diffraction scans for the as-pressed pellet and as-sintered pellet of Example 5, respectively.
Figure 9B:
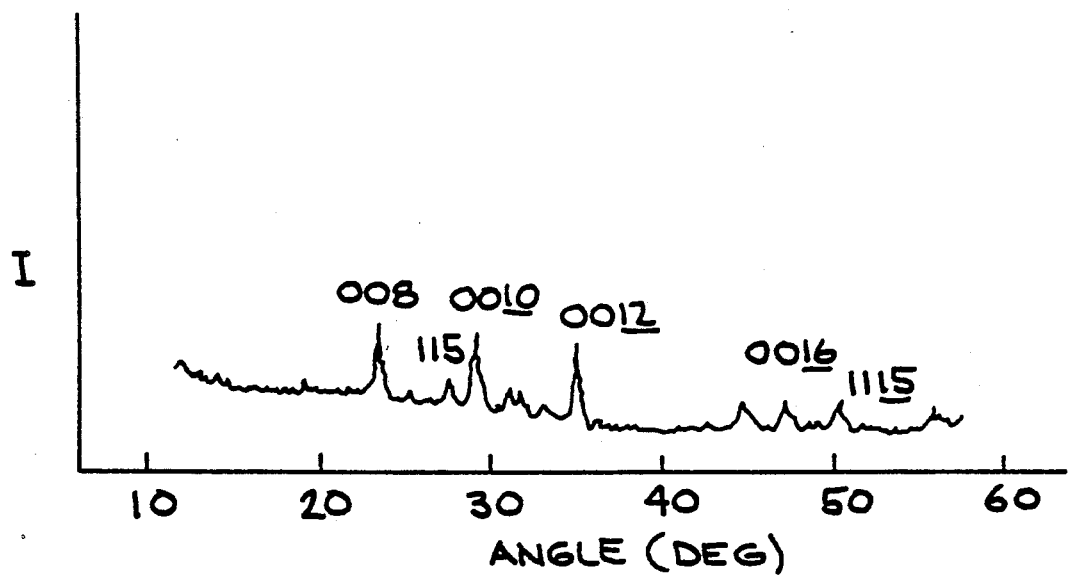

X-ray diffraction scans for the resulting pellet as-pressed and as-sintered are shown in FIGS. 9A and B, respectively. The strong zero-zero-even number reflections are indicative of substantial preferential crystallographic alignment with the c-axis along the axis of the disk-shaped sintered pellet.

Figure 10:
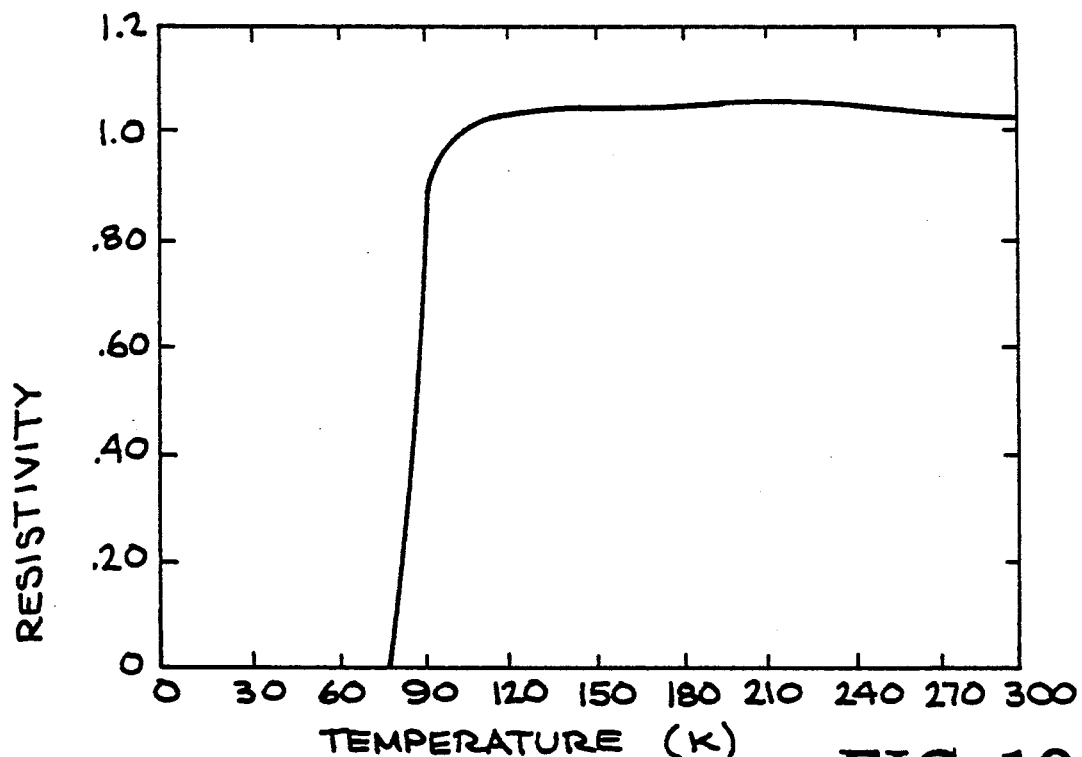
FIG. 10 shows the electrical resistivity of the sintered pellet of Example 5.

The electrical resistivity of the sintered pellet is shown in FIG. 10. The superconducting transition was at $T_c=90°$ K. and the width was about 15° K. as for the shock-compacted and annealed specimen in FIG. 8.

Figure 6:
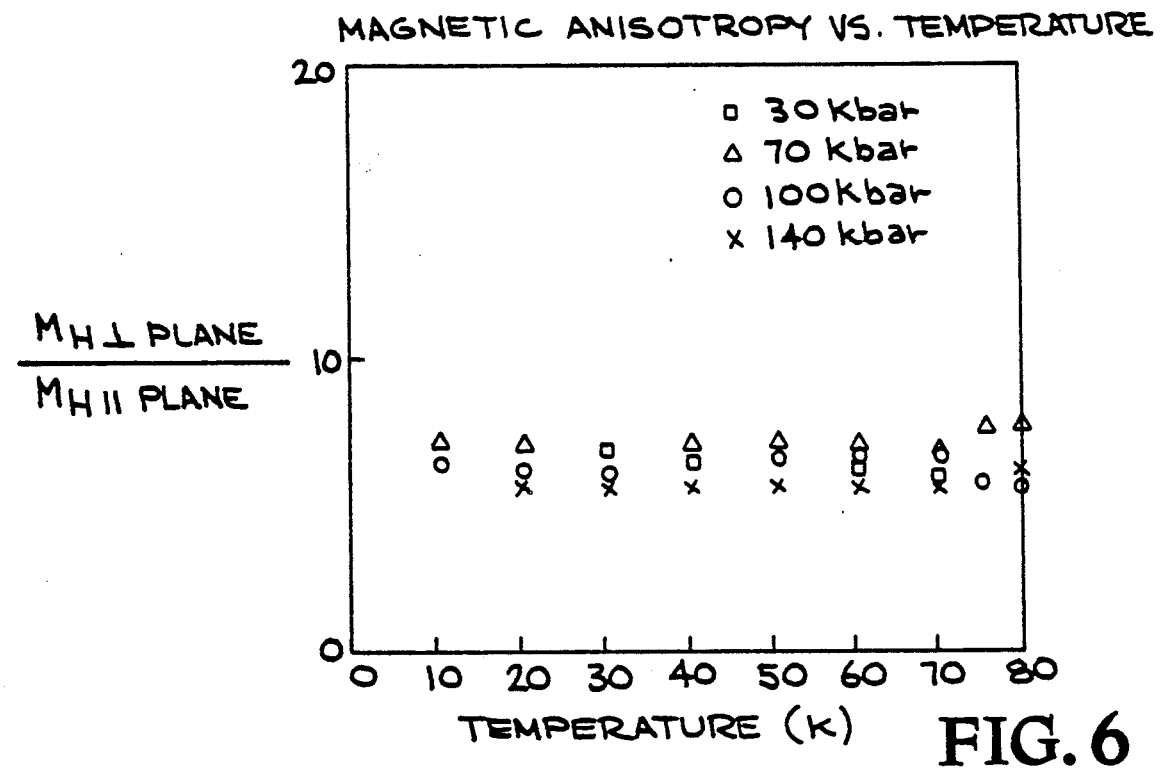
FIG. 6 shows a plot of the ratio of the screening moment in the perpendicular to those in the parallel magnetic field configuration from shock compacted disks in Example 4.
Figure 11:
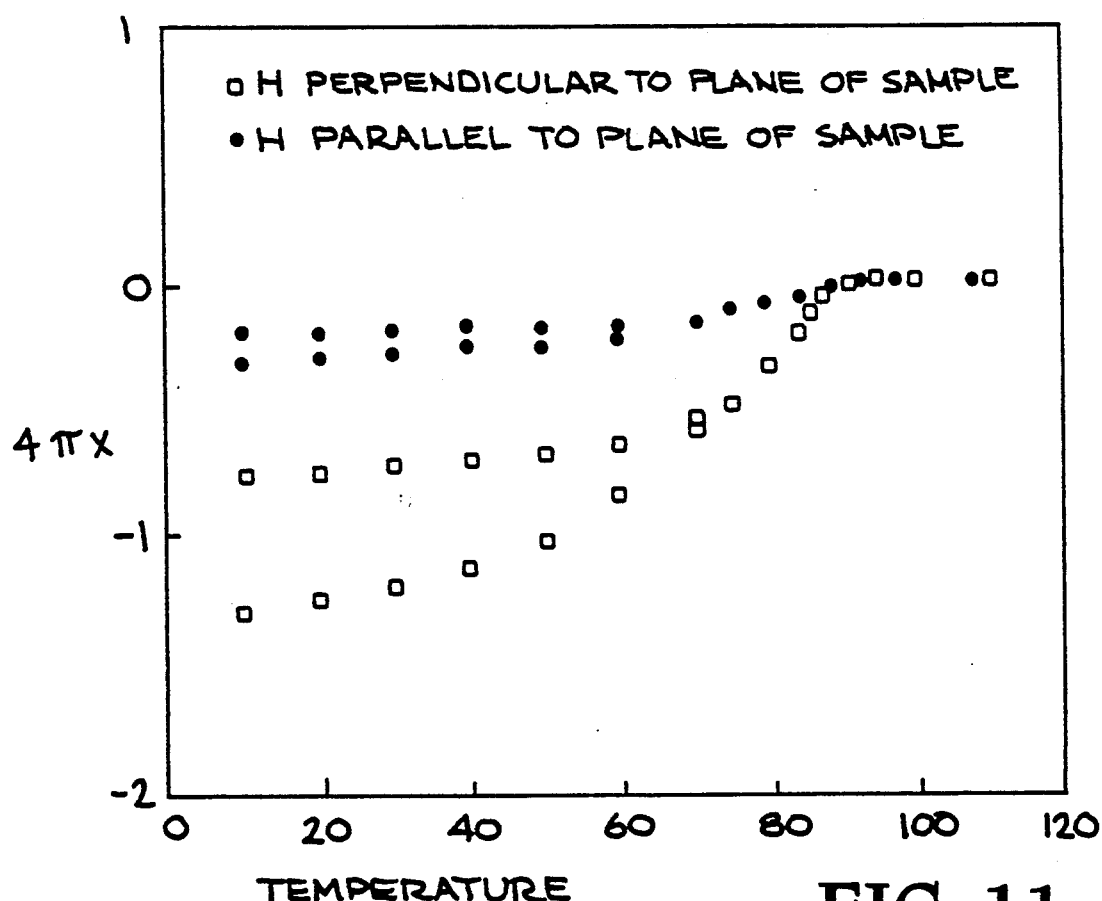
FIG. 11 shows the magnetic data, screening and Meissner signals for a 20 oe magnetic field applied parallel and perpendicular to the axis of the disk-shaped sintered pellet of Example 5.

The magnetic data, screening and Meissner signals for a 20 oe magnetic field applied parallel and perpendicular to the axis of the disk-shaped pellet, are shown in FIG. 11. The ratio of the screening magnetic moments in parallel and perpendicular orientation is about 6, which is almost as large as that of the shock compacts, as seen in FIG. 6. Note that the magnetic field orientation parallel to the cylindrical axis of the sintered pellet was equivalent to the field orientation perpendicular to the face of the shock-compacted disks.

A second pellet was prepared by tapping platelet particles, cold-pressing, and sintering at 800° C. in oxygen for 12 hours, slow cooling to 600° C., and then fast cooling in He to room temperature. The x-ray diffraction pattern showed that crystallographic orientation was maintained and the electrical resistance data showed metallic behavior above $T_c$, as in FIG. 8. The resistance of this sintered specimen went to zero at about 5° K. higher temperature than the shocked and annealed specimen of FIG. 8.

We claim:

1. A method of fabricating oriented compacts of superconducting and/or permanent magnetic material comprising:
    a. providing a base layer of support material,
    b. mechanically orienting aligned superconducting or permanently magnetic particles into the desired orientation on said base layer, without mixing said particles with a liquid,
    c. optionally covering said particles with a support material, d. fabricating the base layer and oriented particles assemblage into a desired construct and e. recovering the resulting fabricated material.

2. In the method of claim 1, wherein said aligned particles are preselected to fall within a pre-determined size limit tailored to produce specific characteristics in the resulting fabrication.

3. In the method of claim 1, wherein said aligned particles are granules having platelet-like or needle-like morphology generally oriented with the basal plane crystallographic high-$J_c$ direction in the desired direction of electrical current flow.

4. In the method of claim 3, wherein said granules are about 10 μm thick with a length and width which range between about 30 μm and 100 μm.

5. In the method of claim 4, wherein said granules are about 30-40 μm wide with a length which ranges between about 30 μm and 100 μm.

6. In the method of claim 4, wherein said granules have a length and width which range between about 60 μm and 50 μm.

7. In the method of claim 3, wherein said granules are about 20 μm thick with a length and width which range between about 60 μm and 200 μm.

8. In the method of claim 3, wherein said granules are about 60 μm thick with a length and width which range between about 180 μm and 600 μm.

9. In the method of claim 3, wherein said granules are about 1 μm thick and about 10 μm to 80 μm in diameter.

10. In the method of claim 1, wherein said aligned particles are in the form of oriented fibers.

11. In the method of claim 10, wherein said oriented fibers are so oriented that the basal-plane crystallographic high $J_c$ direction is parallel or near to parallel to the axis of the fiber.

12. In the method of claim 10, wherein said oriented fibers are from about 1 mm or more in length and 20 μm to 300 μm in diameter.

13. The method of claim 12, wherein said oriented fibers are about 50 μm to 100 μm in diameter.

14. In the method of claim 1, wherein said particles are comprised of ceramic oxides of the formula $XBa_2Cu_3O_{7-x}$ where X is selected from the group consisting of Y, Nd, Sm, Eu, Gd, Dy, Ho, Er, Tm, Yb or Lu, and other rare earth elements, and O is optionally partially replaced by F, Cl, Br and other halides either singly or in combination, and where x is a number less than 1.

15. In the method of claim 1, wherein said particles are selected from the group consisting of $Bi_2Sr_2Ca_1Cu_2O_x$, and $Tl_2Ca_2Ba_2Cu_3O_x$.

16. In the method of claim 1, wherein said particles are comprised of $Nd_{2-x}Ce_xCuO_4$.

17. In the method of claim 1 wherein said superconducting particles are selected from the group consisting of Pb/Mo/S, Eu/Mo/S,Sn/Eu/Mo/S,Pb/Eu/Mo/S,-La/Eu/Mo/S,Sn/Al/Mo/S,Nb/N,Mo/N, V/Si,Nb-/Si,Nb/Si/Ge,Nb/Al,NbGa,Nb/Ti and Nb/Zr and said permanently magnetic particles are selected from the group consisting of Sm/Co,Fe/B/Nd, Fe/B/Pr-,Fe/B/Sm,Fe/B/Eu,Fe/B/Co,Fe/B/Ni,Fe/B/Nd/Pr-,Fe/B/Nd/Sm, Fe/B/Nd/Eu,Fe/B/Nd/Co, and Fe/B/Nd/Ni.

18. In the method of claim 1, wherein said mechanical orientation is accomplished through deposition from a means of transferal or through application on a grooved substrate.

19. In the method of claim 1, wherein said particles are attached to the support material using static electric forces and/or a physically adhering substance.

20. In the method of claim 1, wherein said particles are powder particles of platelet shape which are deposited on the surface of the base layer, and are self-oriented.

21. In the method of claim 20, wherein said particles are tapped after deposition sufficiently to achieve further alignment and increased packing density.

22. The method of claim 1, wherein said oriented particles are mechanically aligned, with the high-$J_c$ crystallographic direction within a certain degree tolerance to the desired direction of current flow, said degree tolerence being:

a. to the plane of the desired direction of current flow in the case of platelet-shaped particles and/or b. to the linear vector of the desired direction of current flow in the case of fiber or needle-shaped materials.

23. In the method of claim 22, wherein said oriented particles are mechanically aligned to be 30° or less from center.

24. In the method of claim 23, wherein said oriented particles are mechanically aligned to be 15° or less from center.

25. In the method of claim 24, wherein said oriented particles are mechanically aligned to be 5° or less from center.

26. In the method of claim 1, wherein step d is accomplished by shock compaction with pressure from about 10 to 200 kbars.

27. In the method of claim 26, wherein said shock compaction is at pressures from about 50 to 150 kbar.

28. In the method of claim 27, wherein said shock compaction is at pressures from about 60 to 110 kbar.

29. In the method of claim 1, wherein step d is accomplished by shock compaction from about 0.1 to 10 microseconds.

30. In the method of claim 1, wherein step d is accomplished by two-stage light-gas gun, a single-stage light-gas gun, a powder gun, a rail gun, an air gun, explosives, or magnetic-driven high speed compression.

31. In the method of claim 1, wherein step d is accomplished by use of a high strain rate deformation apparatus, or rapidly applied gas pressure to a conventional opposed anvil press.

32. In the method of claim 1, wherein step d is accomplished by sintering to up to 1000° C., or hot isostatic pressing.

33. The method of claim 1, wherein a metal powder is mixed with said superconducting or permanently magnetic particles prior to step b and/or said base layer and/or said support material is a metal foil and/or powder.

34. The method of claim 33, wherein said metal foil and/or powder comprises Au, Ag, Al, and/or Cu.

35. The method of claim 33, wherein said powder is from 1 μm to 40 μm in size.

36. The method of claim 35, wherein said powder is from 2 μm to 10 μm in size.

37. The method of claim 33, wherein the particle sizes of said powders are mixed in selected percentages to provide the desired characteristics for the final product.

38. A superconducting article produced by the method of claim 1.

39. A device containing the superconducting article of claim 38.

40. The device of claim 39, wherein said device is long power transmission cable, high field magnetic device, computer and/or adjunct device, accelerator, free electron laser, magnetic resistance device, high q-high power RF structure, beam transport magnet, high emittance accelerator cathode structure, wriggler magnets, magnetic resonance imaging equipment, SQUID diagnostics apparatus, small oxide magnets, NbN technology devices, NbN supercomputers, superconducting generators, magnetic energy storage device, propulsion apparatus using a gas turbine, or maglev transportation devices.

41. The method of claim 1, wherein step d is performed by hot isostatic pressing, pulsed hot isostatic pressing, cold or hot pressing followed by sintering, or doctor blade techniques.

42. The method of claim 1, wherein step d comprises shock preprocessing of precursor materials.

* * * * *